(12) United States Patent
Nakata (10) Patent No.: US 7,214,557 B2
(45) Date of Patent: May 8, 2007

(54) LIGHT RECEIVING OR LIGHT EMITTING MODULAR SHEET AND PROCESS FOR PRODUCING THE SAME

(75) Inventor: Josuke Nakata, Kyoto (JP)

(73) Assignee: Kyosemi Corporation, Kyoto (JP)

( * ) Notice: Subject to any disclaimer, the term of this patent is extended or adjusted under 35 U.S.C. 154(b) by 0 days.

(21) Appl. No.: 10/569,166

(22) PCT Filed: Oct. 24, 2003

(86) PCT No.: PCT/JP03/13666

§ 371 (c)(1),
(2), (4) Date: Mar. 13, 2006

(87) PCT Pub. No.: WO2005/041312

PCT Pub. Date: May 6, 2005

(65) Prior Publication Data

US 2006/0169992 A1    Aug. 3, 2006

(51) Int. Cl.
*H01L 21/00* (2006.01)

(52) U.S. Cl. .................... 438/34; 438/73; 438/88; 438/466

(58) Field of Classification Search .................. 257/99; 438/34, 73, 88, 69, 466
See application file for complete search history.

(56) References Cited

U.S. PATENT DOCUMENTS

| | | | |
|---|---|---|---|
| 3,038,952 A | 6/1962 | Ralph | |
| 3,350,775 A | 11/1967 | Iles | |
| 3,433,676 A | 3/1969 | Stein | |
| 3,998,659 A | 12/1976 | Wakefield | |
| 4,021,323 A | 5/1977 | Kilby et al. | |
| 4,126,812 A | 11/1978 | Wakefield | |
| 4,224,081 A | 9/1980 | Kawamura et al. | |
| 4,582,588 A | 4/1986 | Jensen et al. | |

(Continued)

FOREIGN PATENT DOCUMENTS

EP    0 866 506    9/1998

(Continued)

OTHER PUBLICATIONS

U.S. Appl. No. 10/169,017, Nakata.

*Primary Examiner*—Sara Crane
(74) *Attorney, Agent, or Firm*—Jordan and Hamburg LLP (57) ABSTRACT

A light receiving or light emitting modular sheet having a plurality of spherical elements arranged in matrix. It is constituted only of acceptable spherical elements and photoelectric conversion efficiency thereof is enhanced.

The light receiving modular sheet (1) comprises a plurality of spherical solar cell elements (2) arranged in matrix, a meshed member (3), and a sheet member (4). Each solar cell element (2) comprises a spherical pn junction (13), and positive and negative electrodes (14, 15) formed oppositely while sandwiching the center of the solar cell element (2) and being connected with respective electrodes of the pn junction (13). The meshed member (3) has a plurality of conductive wires (20, 21) arranged in parallel in order to connect the plurality of spherical solar cell elements (2) in each column electrically in parallel, and insulating tensile wires (22) arranged between the rows of solar cell elements (2) to cross the conductive wires (20, 21) perpendicularly while being woven in a meshed form to secure the plurality of conductive wires (20, 21).

9 Claims, 8 Drawing Sheets

U.S. PATENT DOCUMENTS

| | | | |
|---|---|---|---|
| 4,583,588 | A | 4/1986 | Franzolini et al. |
| 4,691,076 | A | 9/1987 | Levine et al. |
| 5,028,546 | A | 7/1991 | Hotchkiss |
| 5,419,782 | A | 5/1995 | Levine et al. |
| 5,428,249 | A | 6/1995 | Sawayama et al. |
| 5,431,127 | A | 7/1995 | Stevens et al. |
| 5,469,020 | A | 11/1995 | Herrick |
| 5,538,902 | A | 7/1996 | Izu et al. |
| 6,204,545 | B1 | 3/2001 | Nakata |
| 6,265,242 | B1 | 7/2001 | Komori et al. |
| 6,294,822 | B1 | 9/2001 | Nakata |
| 6,355,873 | B1 | 3/2002 | Ishikawa |
| 6,744,073 | B1 | 6/2004 | Nakata |
| 7,109,528 | B2 | 9/2006 | Nakata |
| 7,144,830 | B2 * | 12/2006 | Hill et al. .................. 442/205 |
| 2004/0009729 | A1 * | 1/2004 | Hill et al. .................. 442/208 |
| 2004/0238833 | A1 | 12/2004 | Nakata |
| 2005/0127379 | A1 | 6/2005 | Nakata |
| 2006/0043390 | A1 | 3/2006 | Nakata |
| 2006/0086384 | A1 | 4/2006 | Nakata |
| 2006/0133073 | A1 | 6/2006 | Nakata et al. |
| 2006/0169992 | A1 | 8/2006 | Nakata |

FOREIGN PATENT DOCUMENTS

| | | |
|---|---|---|
| EP | 0 982 780 | 3/2000 |
| EP | 1 255 303 | 11/2002 |
| GB | 1195547 | 6/1970 |
| JP | 1-179374 | 7/1989 |
| JP | 5-36997 | 2/1993 |
| JP | 6-013633 | 1/1994 |
| JP | 8-199513 | 8/1996 |
| JP | 9-49213 | 2/1997 |
| JP | 09-162434 | 6/1997 |
| JP | 9-162434 | 6/1997 |
| JP | 10-33969 | 2/1998 |
| JP | 2000-22184 | 1/2000 |
| JP | 2000-259992 | 9/2000 |
| JP | 2001-102618 | 4/2001 |
| JP | 2001-119093 | 4/2001 |
| JP | 2001-156315 | 6/2001 |
| JP | 2001-168369 | 6/2001 |
| JP | 2001-177132 | 6/2001 |
| JP | 2001-210834 | 8/2001 |
| JP | 2001-210848 | 8/2001 |
| JP | 2001-267609 | 9/2001 |
| JP | 2002-50780 | 2/2002 |
| JP | 2002-164554 | 6/2002 |
| WO | WO-98/15983 | 4/1998 |
| WO | WO-98/36461 | 8/1998 |
| WO | WO-98/36461 | 8/1998 |
| WO | WO-01/99202 | 12/2001 |
| WO | WO-03/017382 | 2/2003 |
| WO | WO-03/017383 | 2/2003 |
| WO | WO-03/036731 | 5/2003 |

* cited by examiner

LIGHT RECEIVING OR LIGHT EMITTING MODULAR SHEET AND PROCESS FOR PRODUCING THE SAME

TECHNICAL FIELD

The present invention relates to a light receiving or emitting module sheet and the production method thereof, and relates particularly to a light receiving or emitting module sheet having conductive wires electrically connected to spherical elements and insulating tension wires for fixing the conductive wires in a woven mesh structure.

BACKGROUND OF THE RELATED ART

Solar batteries in currently practical use comprise a flat pn junction formed by diffusing impurities in a flat semiconductor wafer. The solar batteries having this structure produce maximum output when light enters the light receiving surface at a right angle. Output decreases as light enters the light receiving surface at smaller angles. These solar batteries have a strong directional pattern. It would be difficult to say that they constantly utilize light in an efficient manner. Furthermore, wafers are produced by slicing a semiconductor crystal ingot and, thus, there are significant processing losses including margins to cut, which leads to increased production costs.

U.S. Pat. No. 4,581,103 discloses a solar battery element that is produced by melting and dropping a highly pure metal silicon material to form p-type crystal particles and diffusing n-type impurities in the p-type crystal to form a spherical pn junction and a solar battery module produced by connecting those solar battery elements using aluminum foil. The spherical solar battery elements of the solar battery module do not have individual electrodes before being assembled into a module, and are mechanically pressed into pores formed in a sheet of aluminum foil, electrically connecting the n-type surface. Then, the part of the n-type layer surface of the solar battery element that protrudes downward from the pore is removed by, for example, etching, to expose the p-type silicon or the core, causing the p-type silicon to make contact with another sheet of aluminum foil to form a positive electrode. A number of solar battery elements having a pn junction are connected in this way to form a module in which multiple solar battery elements are given electrodes and connected in parallel by two sheets of aluminum foil. In producing a solar battery module in this way electrodes are formed and connected in parallel concurrently using two sheets of aluminum foil. However, the p-type region is exposed after the n-type layer is connected to the aluminum foil, making it is difficult to evaluate the properties and quality of individual solar battery elements. Furthermore, this structure only allows for parallel connection. Another solar battery module must be connected in order to increase the output voltage. When the solar battery elements have a smaller diameter, the distance between the two aluminum foil sheets is decreased, making it difficult to insulate the aluminum foil from each other, and complicating the production process. The positive and negative electrodes are formed below the center of the solar battery element; in other words, they are formed at asymmetrical positions. This causes several disadvantages. For example, sufficiently improved photoelectric conversion efficiency is not available because the electric current between the positive and negative electrodes is localized at points where the distance between the electrodes is smaller. The aluminum foil blocks light and, therefore, only the light receiving surface above the aluminum foil is useful. Light from all directions is not received and, therefore, the output is not increased.

Japanese Laid-Open Patent Publication H09-162434 discloses a solar battery sheet in which multiple spherical solar battery elements are supported by a glass fiber cloth formed by weaving vertically extended conductive wires and horizontally extended glass fibers. In such a solar battery, the solar battery elements are supported by conductive wires, by which they are easily insulated from each other.

However, also in the solar battery elements used in the solar battery described in Japanese Laid-Open Patent Publication H09-162434, the n-type layer is connected to a negative electrode conductive wire, exposing the p-type region which is entirely surrounded by the n-type layer and connected to a positive electrode wire. Only the n-type layer is externally exposed before the conductive wires and solar battery elements are connected, making it so that the individual solar battery elements cannot be inspected before being connected, with the same problems as exist in the afore-mentioned citations. The positive conductive wire connected to the p-type region is also connected to the n-type layer. Then, the n-type layer is irradiated with light for electrochemical etching to separate the pn junction, by which the positive electrode wire is connected only to the p-type region. Solar battery elements are etched at different rates, making it difficult to reliably separate the pn junction in all the solar battery elements.

The solar battery element of this publication also has the same problem as the afore-mentioned citations because it is connected to the positive and negative electrode conductors asymmetrically about the center, with the disadvantage that, when the solar battery elements are replaced with spherical light emitting diodes, spherical light emitting diodes cannot be used because they emit light in a limited region between the conductive wires and fail to emit light in all directions.

In WO98/15983, the inventor of the present application proposed multiple spherical elements that are solar battery elements or light emitting devices and a light receiving or emitting module sheet in which the spherical elements are connected. The spherical element comprises a spherical p-type (or n-type) single crystal semiconductor (such as silicon), an n-type (or p-type) diffused layer formed near the surface of the single crystal semiconductor, a nearly spherical pn junction, and a pair of negative and positive electrodes provided opposite to each other about the center of the spherical single crystal semiconductor. A number of these spherical elements are arranged in a matrix of multiple rows and multiple columns and are connected in series and/or in parallel to constitute a light receiving or emitting module sheet.

The spherical elements position the electrodes at opposite positions to one another about their center. It is easy to connect multiple spherical elements in series by arranging the positive and negative electrodes of adjacent spherical elements to make direct contact with each other. However, it is not easy to connect spherical elements in parallel.

The inventor of the present application provided a resolution to this problem in WO03/017382 in which two parallel conductive wires are used to flank and connect in parallel the positive and negative electrodes of spherical elements arranged with their electrodes aligned to form a column of spherical elements and, the conductive wires of the adjacent columns of spherical elements then being connected to connect the columns of spherical elements in series.

The light receiving or emitting module sheet has the problem that its tensile strength is high in the lengthwise direction of the conductive wires, but is significantly lower in a direction orthogonal thereto. Further, it is necessary to simplify the connection between the spherical elements and conductive wires and improve productivity.

Objects of the present invention include providing a light receiving or emitting module sheet that may be constituted only by good spherical elements, a light receiving or emitting module sheet that has a high tensile strength, a light receiving or emitting module sheet that yields a high photoelectric or electrophoto conversion rate using spherical elements, and a light receiving or emitting module sheet that is easy to produce. Other objects of the present invention will apparent from the description of the embodiments of the present invention.

SUMMARY OF THE INVENTION

The light receiving or emitting module sheet according to present invention comprises plural spherical elements having a light receiving or emitting function, each spherical element having a nearly spherical pn junction, and positive and negative conductive wire connecting parts provided at both ends of the spherical element and connected to both ends of the pn junction; the plural spherical elements being arranged in a matrix with their polarity aligned, plural conductive wires being arranged in parallel to electrically connect in parallel plural spherical elements in each of plural columns via the positive and negative conductive wire connecting parts of the plural spherical elements in each column, and plural insulating tension wires arranged between rows of the spherical elements in a direction orthogonal to the conductive wires and woven into a mesh structure with the plural conductive wires for fixing the multiple conductive wires.

When used as a light receiving module sheet, light enters the module sheets regardless of incidental directions and reaches plural spherical elements arranged in a matrix with their polarities aligned. The nearly spherical pn junction formed in the spherical element receives light which has been converted to electric energy by the light receiving function of the spherical element. The electric energy is output outside via the positive and negative conductive wire connecting parts provided at either end of the spherical element and connected to both ends of the pn junction. When used as a light emitting module sheet, electric energy supplied to the spherical elements from the conductive wires via the conductive wire connecting parts is converted to optical energy by the pn junction of the spherical elements and the light is emitted to the outside.

The spherical elements have positive and negative conductive wire connecting parts connected to both ends of the pn junction, making it so the spherical elements may be inspected before they are mounted in a light receiving or emitting module sheet. Consequently, only good spherical elements may be mounted in a light receiving or emitting module sheet, which allows for reliable production of high quality module sheets. Additionally, with the positive and negative conductive wire connecting parts being formed on the spherical elements prior to being mounted, the conductive wire connecting parts and conductive wires are easily connected, simplifying the production process.

Plural conductive wires extending in the columnar direction and multiple insulating tension wires extending in the row direction are woven into a mesh structure, yielding high strength. The positive and negative conductive wire connecting parts provided at either end of the spherical element are connected to the nearly spherical pn junction and, utilizing the entire region of the pn junction, more efficiently generating electricity or light.

In addition to the above structure, the following structure may be used as appropriate.

(1) The positive and negative conductive wire connecting parts of each of the spherical elements are provided opposite to each other about the center of the spherical element.

(2) A transparent sealing member that houses the plural spherical elements together with plural conductive wires and plural tension wires in an embedded manner is provided.

(3) Each of the spherical elements is a photodiode or a solar battery element.

(4) Each of the spherical elements is a light emitting diode element.

(5) The conductive wires are connected to the positive and negative wire connecting parts by using any one selected from among soldering, conductive synthetic resin, and alloyed metal.

(6) The conductive wires are embedded in the sealing member so as to be at least partially exposed.

(7) Insulating tension wires provided and arranged between columns of the spherical elements and woven with the conductive wires in parallel.

(8) The sealing member is a flexible member made of a transparent synthetic resin material.

(9) A reflecting film that reflects light incidental from a light incident side is composed on the surface of the side opposite to the light incident side of the sealing member.

(10) The sealing member comprises of a flexible transparent cushion layer that houses plural spherical elements in an embedded manner and transparent surface layers joined to the cushion layer on either side.

(11) The sealing member has a heat reflecting film made of a polymer material that selectively reflects heat rays that the spherical elements cannot absorb.

(12) A serial connection means is provided that connects in series plural conductive wires that connect the multiple spherical elements in parallel.

The method of producing a light receiving or emitting module sheet according to the present invention is a method of producing a light receiving or emitting module sheet comprising plural spherical elements arranged in a matrix and having a light receiving or emitting function, conductive wires that electrically connect the plural spherical elements in each column, and insulating tension wires woven into a mesh structure with the conductive wires for fixing the conductive wires, characterized by comprising a spherical element production step of producing spherical elements having positive and negative conductive wire connecting parts and a connecting step of melting a joining material for connecting the spherical elements and conductive wires by means of Joule heat by passing electric current through the conductive wires to connect the spherical elements and conductive wires by the joining material.

DETAILED DESCRIPTION OF THE PREFERRED EMBODIMENTS

The preferred embodiment of the present invention is described hereafter. In this embodiment, the present invention is applied to a light receiving module sheet (a solar battery module sheet) in which spherical solar battery elements are arranged in a matrix of multiple rows and multiple columns.

Figure 1:
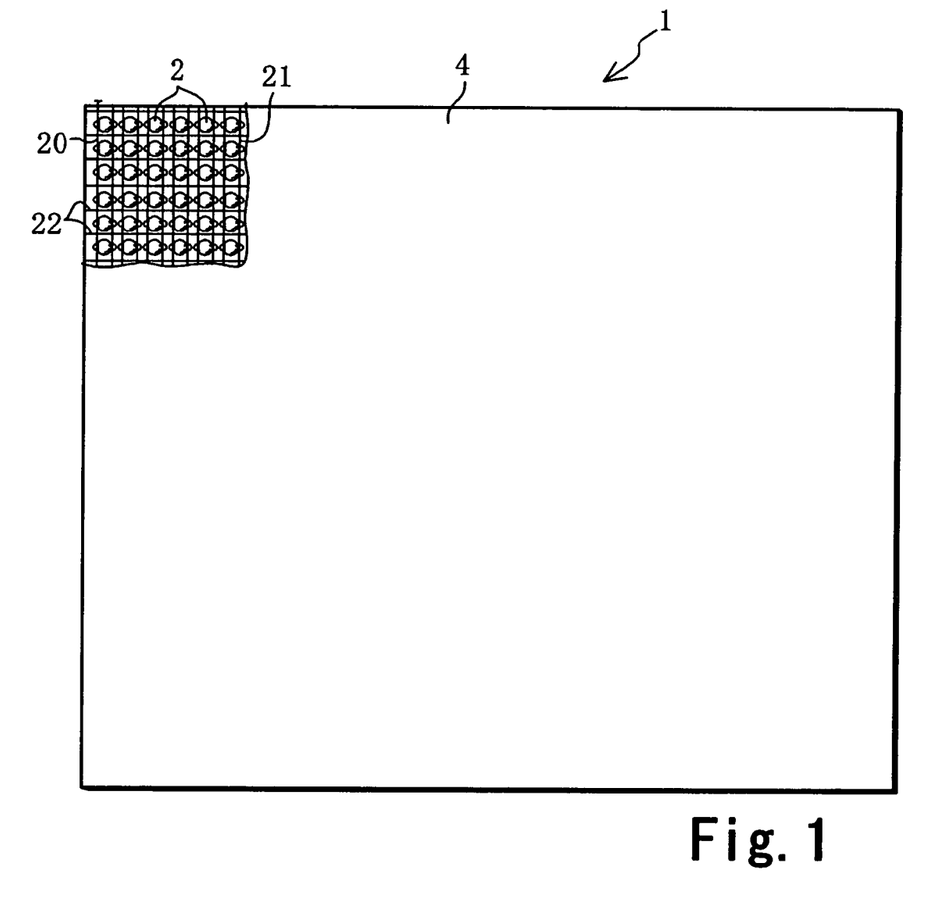
FIG. 1 is a plane view of a light receiving module sheet according to an embodiment of the present invention.
Figure 2:
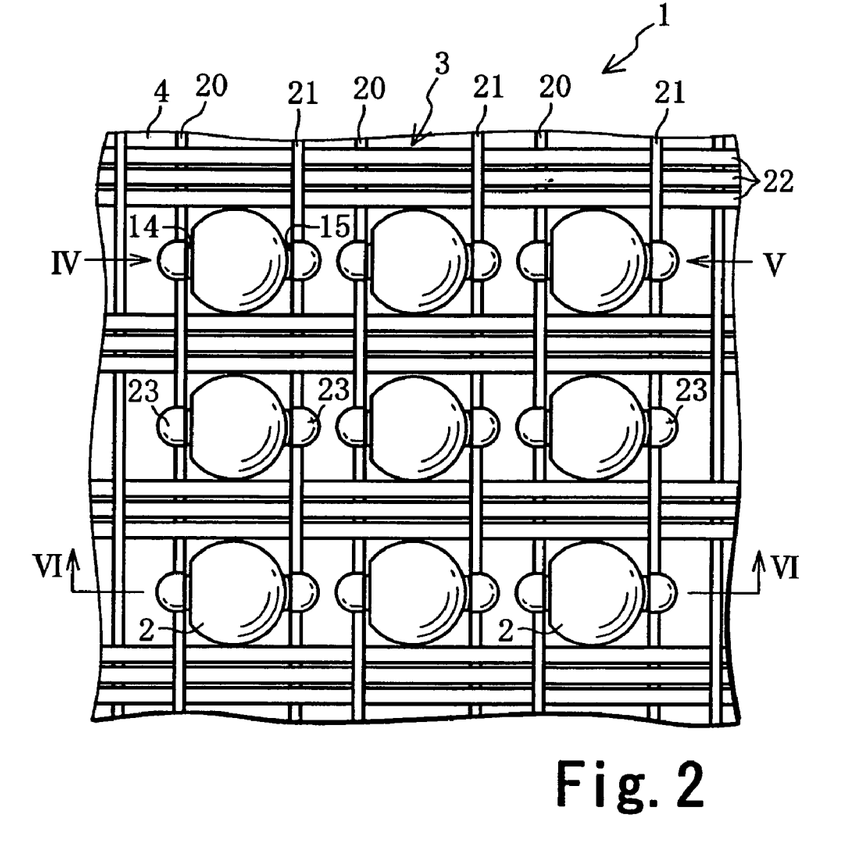
FIG. 2 is a partial enlarged plane view of the light receiving module sheet.

As shown in FIGS. 1 and 2, a light receiving module sheet 1 has a number of solar battery elements 2 (spherical elements), a mesh member 3 (conductive wire-mixed woven glass cloth), and a sealing member 4.

A solar battery element having nearly the same structure as the solar battery element 2 is described in, for example, WO98/15983 and WO03/036731 proposed by the inventor of this application. Therefore, a brief explanation is made hereafter As shown in FIGS. 1 and 2, a number of solar battery elements 2 have a light receiving function to convert optical energy to electric energy and are arranged in a matrix with their polarities aligned. For example, approximately 2000 solar battery elements 2 per 1 Watt power output are used.

Figure 3:
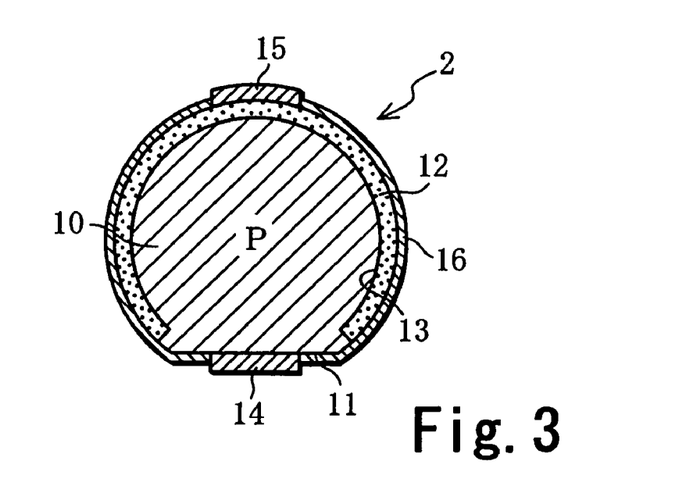
FIG. 3 is an enlarged cross-sectional view of a solar battery element.

As shown in FIG. 3, each solar battery element 2 is formed by a spherical crystal 10 having a diameter of approximately 0.6 to 2.0 mm and made of p-type silicon single crystal with a resistance of approximately 0.3 to 1 Ωm. A flat surface 11 is formed on the spherical crystal 10 at one end. A $n^+$-type diffused layer 12 (approximately 0.4 to 0.5 μm in thickness) diffused with phosphorus (P) is formed on nearly the entire surface region of the spherical crystal 10 except for the flat surface 11. A nearly spherical pn junction 13 is formed between the $n^+$-type diffused layer 12 and the p-type region. When the spherical crystal 10 has a diameter of approximately 1.0 mm, the flat surface 11 has a diameter of approximately 0.5 mm. However, the diameter of the flat surface 11 may be smaller than approximately 0.5 mm.

A positive electrode 14 (a conductive wire connection part) is provided on the flat surface 11 and a negative electrode 15 (a conductive wire connection part) is provided at the position opposite to the positive electrode 14 at about the center of the spherical crystal 10. The positive electrode 14 is connected to the p-type region of the spherical crystal 10 and the negative electrode 15 is connected to the $n^+$-type diffused layer 12. The positive electrode 14 is formed by baking aluminum paste and the negative electrode 15 is formed by baking silver paste. An anti-reflection coating 16 (0.6 to 0.7 μm in thickness) consisting of a $SiO_2$ (or $TiO_2$) insulating film is formed on the entire surface except for the positive and negative electrodes 14 and 15. The solar battery element 2 has a light receiving function and generates an optical electromotive force of 0.5 to 0.6 V between the electrodes 14 and 15 when it receives the sunlight.

Figure 4:
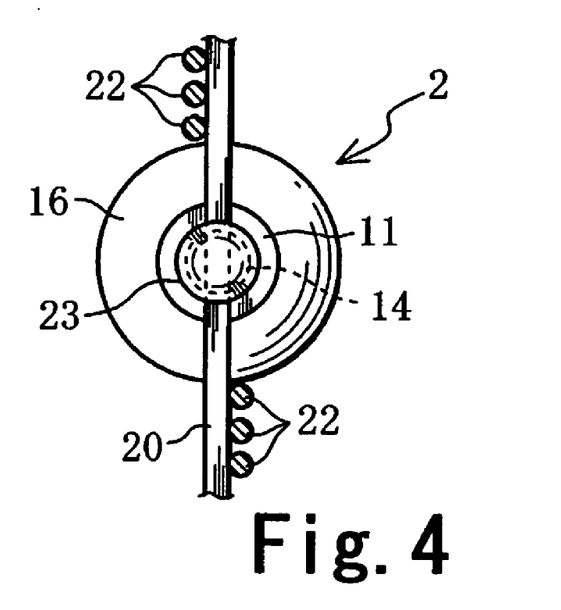
FIG. 4 is a view seen in the arrowed direction IV in FIG. 2.
Figure 5:
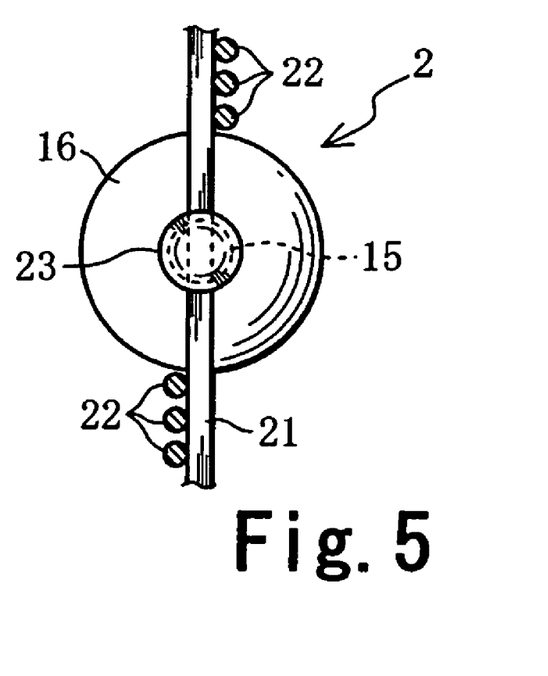
FIG. 5 is a view seen in the arrowed direction V in FIG. 2.

As shown in FIGS. 2, 4, and 5, the mesh member 3 has positive electrode conductive wires 20, negative electrode conductive wires 21, and glass fiber tension wires 22. The conductive wires 20 and 21 are nickel (42%), iron (52%), and chrome (6%) alloy wires having a diameter of 120 μm and a tin plated layer (2 to 5 μm in thickness) on the surface.

As shown in FIG. 2, the conductive wires 20 and 21 extend in parallel in the columnar direction. The distance between the center lines of the positive and negative conductive wires 20 and 21 of adjacent columns of solar battery elements 2 is approximately 0.75 m. The distance between the centers of adjacent columns of the solar battery elements 2 is approximately 1.75 mm. The positive electrode conductive wire 20 is electrically connected to the positive electrode 14 via a solder paste 23 and the negative electrode conductive wire 21 is electrically connected to the negative electrode 15 via a solder paste 23. Multiple solar battery elements 2 in each column are electrically connected in parallel by the conductive wires 20 and 21 and the solar battery elements 2 in all columns are electrically connected in series, as is described later.

Here, the conductive wires are not restricted to the aforementioned structure and may be made of iron, iron (58%)/ nickel (42%) alloy wires, other iron alloy wires, copper wires, beryllium copper wires, phosphorus bronze wires, other copper alloy wires, silver, silver alloy wires, or nickel, nickel alloy wires or a thread of fine wires of these materials, which are selected in view of their electrical, mechanical, and chemical properties. Among these, beryllium copper or phosphorus bronze wires have spring force and, therefore, ensure contact with the solar battery elements 2.

The tension wires 22 are extended between adjacent rows of solar battery elements 2 in the row direction orthogonal to the conductive wires 20 and 21. Each tension wire 22 is made of a thread of seven glass fibers (9.0 μm in diameter). A set of three tension wires 22 is provided between rows at a pitch of approximately 1.75 mm. In order to fix the conductive wires 20 and 21, each tension wire 22 is woven in such a manner that they pass above and below the conductive wires 20 and 21. Multiple conductive wires 20 and 21 and multiple tension wires 22 are woven like a net to form the mesh member 3.

Figure 6:
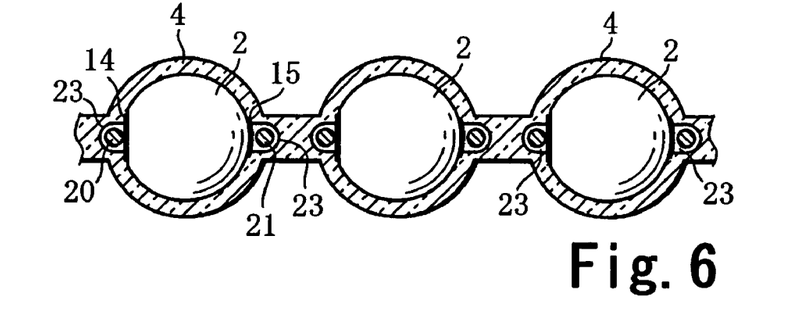
FIG. 6 is a cross-sectional view at VI—VI in FIG. 2.

As shown in FIG. 6, the sealing member 4 is provided to house a number of solar battery elements 2, conductive wires 20 and 21, and tension wires 22 in an embedded manner to protect the solar battery elements 2 and mesh member 3. The sealing member 4 is made of a sheet of transparent insulating polyparaxylene resin having a thickness of approximately 100 μm. Polyparaxylene resin has characteristics such as availability of uniform coating with little pinholes even in minute parts, low gas and vapor permeability, high stability against radiation, high refractive index (approximately 1.64), and low reflection loss on the surface of the solar battery element 2. Formed as a thin layer to cover the surface of solar battery element 2, sealing member 4 advantageously allows for the reception of light in a wide range of directions, low reflection loss, flexibility, light-weight, high tensile or bending strength, and a high light collection rate.

In the light receiving module sheet 1, light enters the light receiving module sheet 1 regardless of the incident direction and multiple solar battery elements 2 arranged in a matrix with their polarities aligned are irradiated with the light. The light is received by a nearly spherical pn junction 13 formed in the solar battery elements 2 and is converted to electric energy by the light receiving function of the solar battery elements 2. The electric energy is output outside via the positive and negative electrodes 14 and 15 provided at positions opposite to each other about the center of each solar battery element 2 and connected to both electrodes of the pn junction 13.

Figure 7:
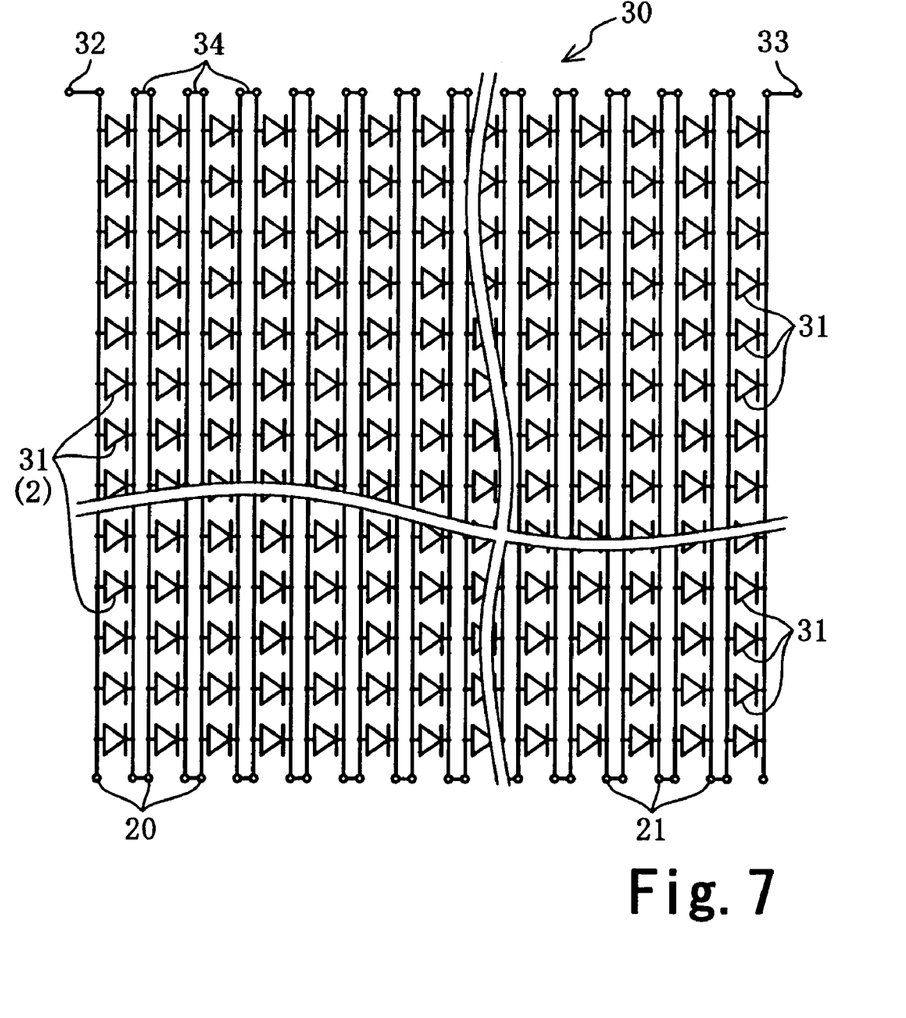
FIG. 7 is an equivalent circuit diagram of solar battery modules contained in the light receiving module sheet.

FIG. 7 shows an equivalent circuit 30 to solar battery modules contained in the light receiving module sheet 1. In equivalent circuit 30, for example, each of a number of solar battery elements 2 arranged in a matrix of multiple rows and multiple columns is replaced by a diode 31. As shown in equivalent circuit 30, the diodes 31 (the solar battery elements 2) in each column are connected in parallel by the positive and negative electrode conductive wires 20 and 21. Further, the positive electrode conductive wire 20 of each column is connected to the negative electrode conductive wire 21 of an adjacent column in series by a serial connection conductive wire 34. An optical electromotive force of approximately n×0.6V is generated between the positive and negative terminals 32 and 33 when one solar battery element 2 has an output of 0.6V and there are m rows and n columns. Assuming one solar battery element 2 generates an electric current I, an electric current of m×I is output from the positive electrode 32 to an external load.

A number of solar battery elements 2 connected in parallel and in series as described above can minimize reduction in output when light does not reach part of the light receiving module sheet and some of the solar battery elements 2 are not available for producing electricity, because the electric current can travel through the other solar battery elements 2.

A method of producing the afore-mentioned light receiving module sheet is described hereafter.

First, a method of producing the solar battery elements 2 is described with reference to FIG. 8. However, this method is described in detail by the inventor of the present application in WO98/15983 and WO03/036731 and, therefore, it is also briefly described here.

First, melted silicon droplets of a fixed quantity are subject to super-cooling for rapid solidification through free-fall, by which a p-type spherical single crystal 10 having a diameter of approximately 1.0 mm is formed. A part of the spherical single crystal 10 is mechanically abraded to form a flat surface 11 (see FIG. 8(*a*)).

Figure 8:
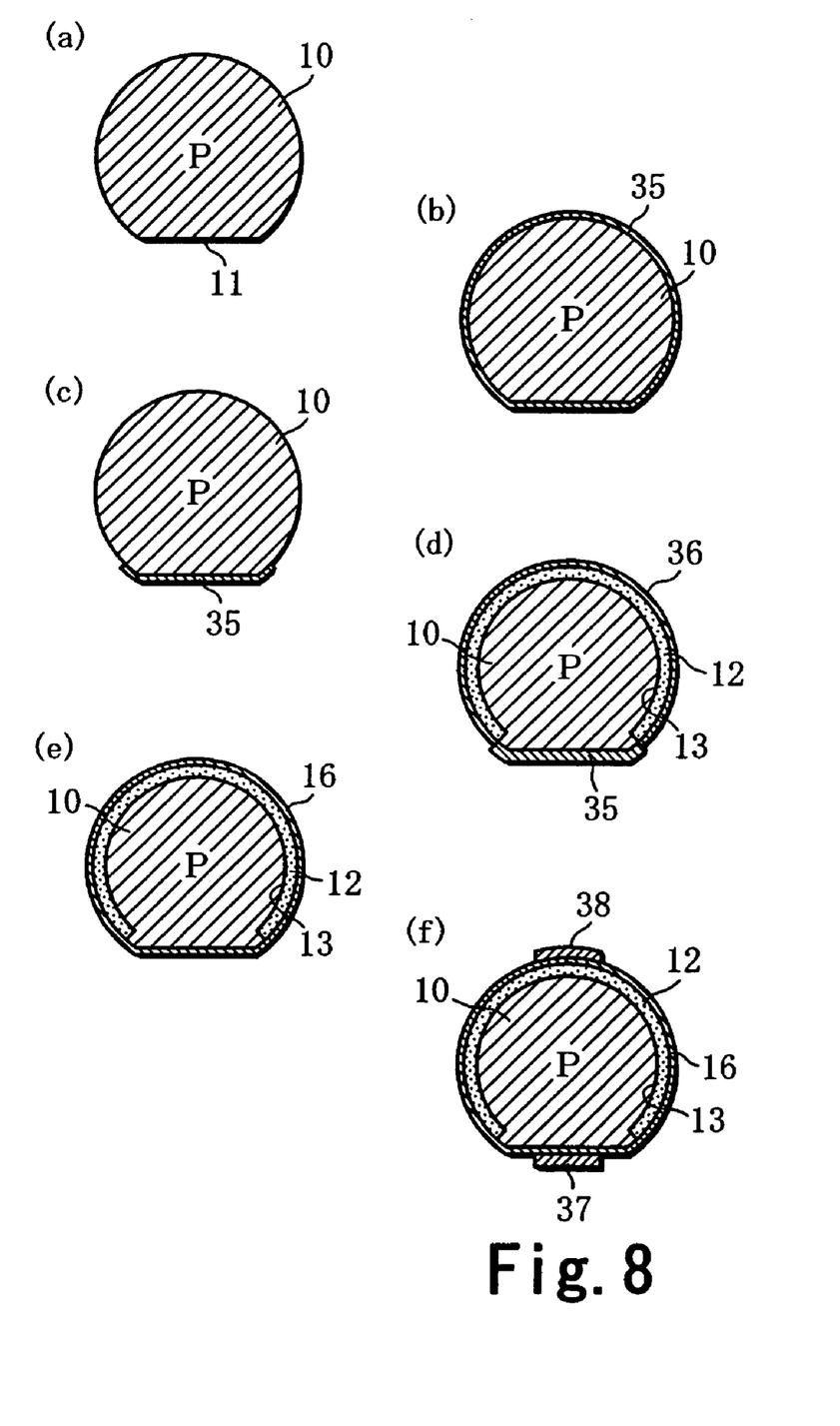
FIG. 8 is an illustration showing solar battery elements at respective production stages.

Then, the spherical single crystal 10 is heated in a vapor-containing oxygen gas at approximately 1000° C. for approximately 40 minutes to form a silicon oxide film 35 having a thickness of approximately 0.3 μm (see FIG. 8(*b*)). Subsequently, an acid-resistant wax is melted on a glass plate to a uniform thickness to create a mask for thermal diffusing impurities (n-type impurities) only in a desired region of the silicon oxide film 35. The flat surface 11 is pressed against the wax surface and the wax is solidified. Then, only the part of the silicon oxide film 35 that is exposed from the solidified wax is removed by immersing it in a buffer etching solution (aqueous $NH_4HF_2$ solution) for etching. Then, the spherical single crystal 10 is removed from the glass plate and the wax is removed (see FIG. 8(*c*)).

Subsequently, the spherical single crystal 10 is heated in nitrogen carrier gas bubbled from a phosphorus oxytrichloride ($POCl_3$) solution at approximately 960° C. for 3 minutes to form a phosphorus silicate glass coating 36 on the surface of the spherical single crystal 10 where the silicon oxide film 35 is absent, and is further heated in an atmospheric gas of dry oxygen at approximately 980° C. for 60 seconds to thermally diffuse n-type impurities (phosphorus) near the surface of the spherical single crystal 10. With the n-type impurities thermally diffused as described above, an $n^+$-type diffused layer 12 is formed on the surface of the spherical single crystal 10 except for on and around the flat surface 11 covered with the silicon oxide film 35 as a mask, a pn junction 13 being formed on the interface between the $n^+$-type diffused layer 12 and the p-type region of the spherical single crystal 10 (see FIG. 8(*d*)).

The silicon oxide film 35 on and around the flat surface 11 is then removed using the buffer etching solution. The spherical single crystal 10 is again heated in dry oxygen gas at approximately 800° C. for 60 seconds to form an anti-reflection coating 16 on the entire surface of the spherical single crystal 10, made of a silicon oxide film and also serving as a passivation coating (see FIG. 8(*e*)).

Then, an aluminum paste 37 is dot printed on the flat surface 11 to form a positive electrode 14. A silver paste 38 is dot printed on the surface of the $n^+$-type diffused layer 12 at the opposite position to the flat surface 11 about the center of the spherical single crystal 10, and the whole spherical single crystal 10 is heated in nitrogen gas at approximately 800° C. for 60 minutes so that the aluminum paste 37 and silver paste 38 penetrate the anti-reflection coating 16 to make an ohmic contact with the p-type region and the $n^+$-type diffused layer 12 of the spherical single crystal 10, respectively, to complete a solar battery element 2 (see FIG. 8(*f*), FIG. 3).

Then, the volt-ampere characteristic of the completed solar battery element 2 is measured under illumination by a solar simulator light source to determine whether the completed solar battery element 2 is good or defective.

Figure 9:
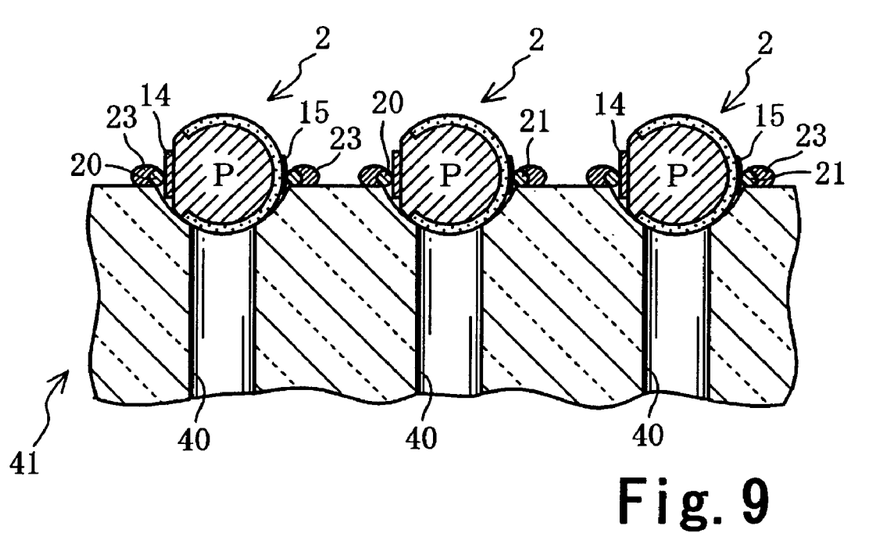
FIG. 9 is an illustration showing a step in which solar battery elements and conductive wires are electrically connected using a positioning jig.

Then, as shown in FIG. 9, a jig 41 is prepared having positioning pores 40 at pre-determined intervals for positioning the solar battery elements 2. Solar battery elements 2 determined to be good are placed on the positioning jig 41 with their electrodes 14 and 15 (the polarities of the electrodes 14 and 15) aligned. Solar battery element 2 has a flat surface 11, making it easy to identify the positive and negative electrodes 14 and 15, facilitating placement with the electrodes 14 and 15 being aligned.

The horizontal equator line of the solar battery elements 2 placed on the positioning jig 41 is nearly at the level of the top surface of the positioning jig 41. Then, the positioning pores 40 are vacuumed to fix the solar battery elements 2 in the positioning pores 40, preventing the solar battery elements 2 from moving or rolling. The positioning jig 41 has a carbon or boron nitride coating on the top surface, preventing the positioning jig 41 from being joined to a joining material such as solder paste 23.

Then, a mesh member 3 formed by weaving conductive wires 20 and 21 and tension wires 22 is prepared. Solder paste 23 is applied by dot printing or by discharging from a dispenser to the points where the positive electrode conductive wires 20 of the mesh member 3 and the positive electrodes 14 are connected and to the points where the negative electrode conductive wires 21 and the negative electrodes 15 are connected. The mesh member 3 is placed on the solar battery elements 2 fixed to the positioning jig 41 from above. Then, an presser jig (not shown) is used to press the mesh member 3 against the top surface of the positioning jig 41 while the solder paste 23 applied to the conductive wires 20 and 21 is pressed against the electrodes 14 and 15. With a number of solar battery elements 2 and the mesh member 3 sitting on the positioning jig 41, the solder paste 23 is irradiated with a focused beam from an infrared lamp to melt it, by which the conductive wires 20 and electrodes 14 are electrically connected and the conductive wires 21 and electrodes 15 are electrically connected. Then, the solder paste 23 is rinsed to remove the contained flux and dried.

In another connection method, an electric current is applied to the conductive wires 20 and 21 to melt the solder paste 23 by means of Joule heat caused by the electric current. Here, the surface tension and flowability of the solder paste 23 is advantageously used for connection. Alternatively, an infrared lamp and Joule heat may be used in combination to melt the solder paste 23 for connection, thereby saving connection time. A conductive epoxy resin may be used to connect the electrodes 14 and 15 and the conductive wires 20 and 21 in place of the solder paste 23. When a conductive epoxy resin is used for the connection, the epoxy resin is discharged from a dispenser at desired points after the mesh member 3 is placed on top of the solar battery elements 2. Then, the conductive epoxy resin is heat cured, for example, using an oven.

Subsequently, a polyparaxylene resin coating is applied as a sealing member 4 over the solar battery elements 2 and mesh member 3 of the light receiving module sheet 1 to a thickness of approximately 100 μm. The sealing member 4 may be formed by, for example, by a chemical vapor deposition (CVD) coating system developed by Union Carbide and Plastic, USA. The sealing member 4 is not restricted to polyparaxylene resin and may be made of a transparent resin such as silicone resin, polyvinyl chloride, and polyester (PET) by spraying or dipping in a solution to form and cure a coating. With the sealing member 4 being formed thereon as described above, the light receiving module sheet 1 is completed.

The functions and advantages of the afore-mentioned light receiving module sheet 1 are described hereafter.

In the light receiving module sheet 1, solar battery elements 2 have the positive electrode 14 connected to the flat surface 11 of the spherical crystal 10 and the negative electrode 15 connected to the n$^+$-type diffused layer 12. Therefore, the solar battery elements 2 may be inspected using, for example, a solar simulator before they are mounted on the light receiving module sheet 1. Hence, the light receiving module sheet 1 is allowed to have only good solar battery elements 2 that have passed the inspection, providing a high quality light receiving module sheet 1. Further, the positive and negative electrodes 14 and 15 are formed on the solar battery elements 2 before being mounted. Therefore, the electrodes 14 and 15 and the conductive wires 20 and 21 are reliably and easily connected, simplifying the production process.

The mesh member 3 is formed by weaving conductive wires 20 and 21 extending in the columnar direction and tension wires 22 extending in the row direction, enabling the realization of a flexible light receiving module sheet 1 or a highly strong light receiving module sheet 1. Particularly, when the tension wires 22 consist of lightweight glass fibers, a lightweight light receiving module sheet 1 may be realized while improving strength.

The solar battery elements 2 are provided with the positive and negative electrodes 14 and 15 being positioned opposite to each other about the center of the solar battery element 2. Therefore, the current generated within the solar battery element 2 runs symmetrically without being localized, significantly reducing resistance loss and allowing almost all electric power generated at the pn junction of the solar battery element 2 to be output. Further, the solar battery elements 2 are provided with a spherical body, enabling them to receive light in all directions and to output all generated electric power, thereby improving power generation efficiency. The light receiving module sheet 1 is protected by a flexible sealing member 4, and can therefore be deformed without damaging the solar battery elements 2 and conductive wires 20 and 21.

The solar battery elements 2 are primarily formed by a p-type spherical single crystal 10 having an n-type diffused layer on the surface. However, they may be primarily formed by an n-type spherical single crystal having a p-type diffused layer on the surface. The semiconductor used in the solar battery elements 2 is not restricted to silicon. Other semiconductors such as GaAs, GaAlAs, InP, InGaP, Ge, GaSb, InGaAs, and InGaN may be used.

Modified embodiments in which the afore-mentioned embodiment is partially modified are described hereafter.

Figure 10:
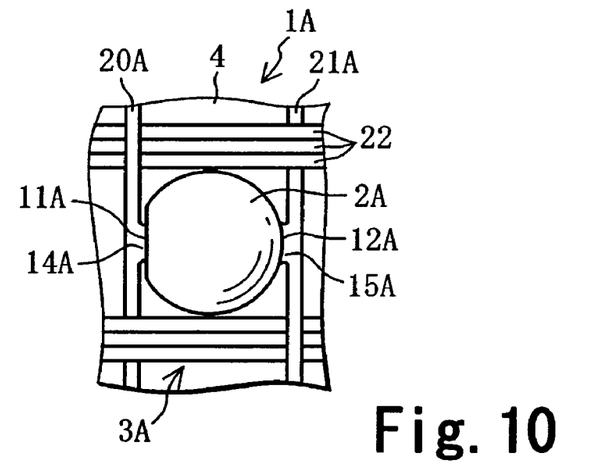
FIG. 10 is a partial enlarged plane view of a light receiving module sheet according to a modified embodiment.

1) Modified Embodiment 1 (see FIG. 10)

In this modified embodiment, solar battery elements having no electrodes are connected to conductive wires by alloy joining to produce a light receiving module sheet 1, the production process of which is described hereafter.

First, the solar battery element shown in FIG. 8(d) is produced. The silicon oxide film 35 is completely removed using the buffer etching solution to produce a solar battery element 2A, and a mesh member 3A is then prepared by weaving positive and negative electrode conductive wires 20A and 21A extending in the columnar direction and tension wires 22 extending in the row direction. Here, the conductive wires 20A and 21A are made of an aluminum line containing 1% to 2% of silicon that is eutectic reactive to silicon and having a diameter of approximately 120 μm. The tension wires 22 are the same as the tension wires in the afore-mentioned embodiment, hence the explanation is omitted.

A number of solar battery elements 2A are placed on a positioning jig similar to the afore-mentioned positioning jig 41 and the mesh member 3A is placed thereon in the manner in which the conductive wires 20A and 21A make contact with the flat surface 11 (a conductive wire connection part) of the solar battery elements 2A and the opposite point (a conductive wire connection part) to the flat surface 11 about the center of the solar battery element 2A, respectively. Then, a large, pulsed direct current is applied to the conductive wires 20A and 21A in a nitrogen gas atmosphere containing several % of hydrogen gas for several seconds for Joule heating, by which the flat surface 11A of the solar battery element 2A and the positive electrode conductive wire 20A are alloy joined and the n$^+$-type diffused layer 12A at the opposite point to the flat surface 11A about the center of the solar battery element 2A and the negative electrode conductive wire 21A are alloy joined. The alloyed regions formed between the conductive wires 20A and 21A and the solar battery element 2A by the alloy joining serve as electrodes 14A and 15A. Alloy joining may be conducted at approximately 570 to 650° C., by which a pulsed current is used for rapid heating and rapid cooling, thereby realizing excellent ohmic contact without running aluminum or excessively deep alloying. After the silicon oxide film 36 is removed, a silicon oxide or titanium oxide passivation coating is formed on the solar battery element 2A by, for example, CVD, and the sealing member 4 is formed over the entire surface of the light receiving module sheet to complete a light receiving module sheet 1A.

The conductive wires 20A and 21A may be made of nickel (42%), iron (52%), and chrome (6%) alloy wires (approximately 120 μm in diameter) in place of aluminum wires. Then, the joining points between the alloy wires and solar battery elements 2A are coated with aluminum or aluminum alloy containing 1% to 2% silicon. Also in this case, electric current is applied to the alloy wires to produce Joule heat and melt the aluminum or aluminum alloy coating, connecting the conductive wires 20A and 21A and the solar battery element 2A.

The alloy wires have lower electrical and thermal conductivity in comparison to the aluminum wires. Advantageously, less electric current is required for joining and tensile strength is improved. Alternatively, copper wires may be used as the conductive wires 20A and 21A in place of aluminum wires, the joining points to the copper wires are coated with a gold alloy such as gold/silicon alloy, gold/germanium alloy, and gold/tin alloy, and an electric current is applied to the conductive wires 20A and 21A to generate Joule heat and melt the gold alloy, thereby connecting the conductive wires 20A and 21A and the solar battery element 2A. Gold alloy allows for alloy joining due to eutectic reaction at lower temperatures than does aluminum.

In this production method, the solar battery element 2A and the conductive wires 20A and 21A may be easily connected without previously forming positive and negative electrodes, by which productivity is improved and production costs are reduced.

Figure 11:
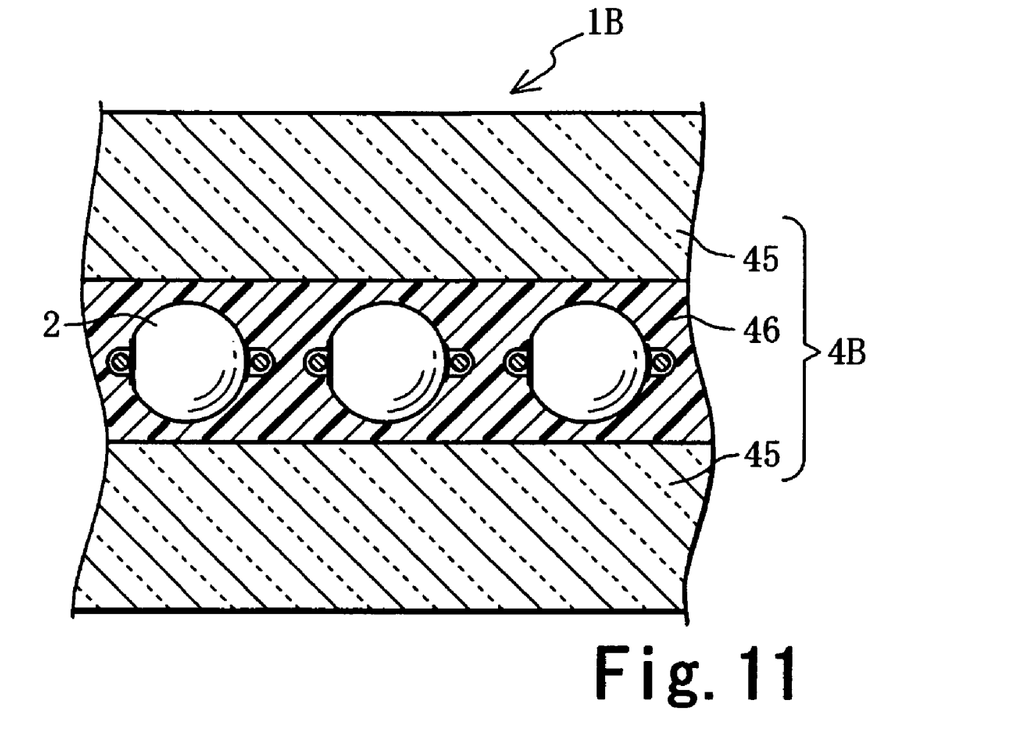
FIG. 11 is a vertical cross-sectional view of the core part of a light receiving module sheet having a sealing members according to a modified embodiment.
Figure 12:
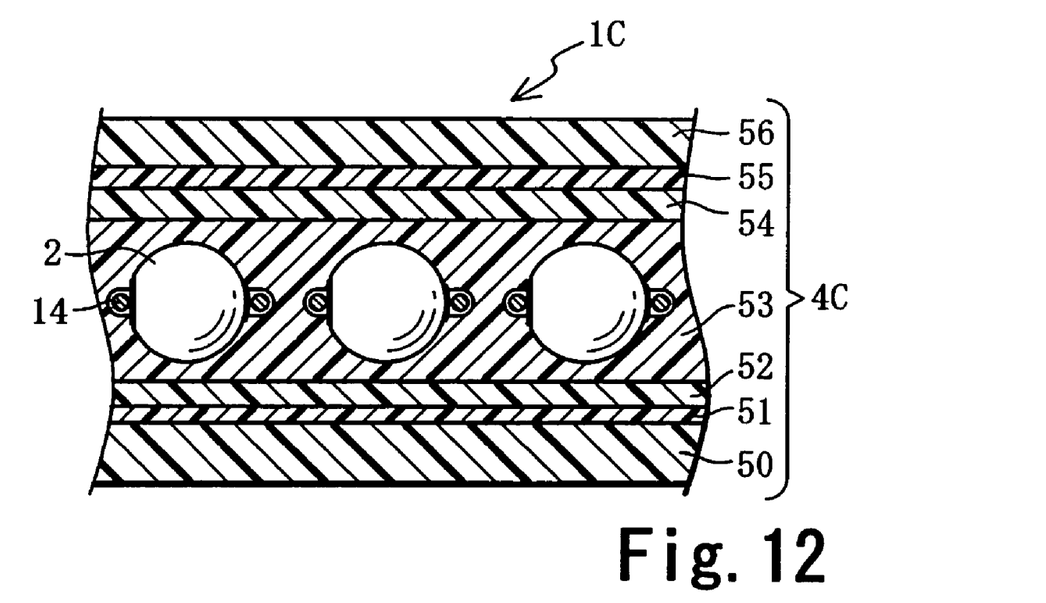
FIG. 12 is a vertical cross-sectional view of the core part of a light receiving module sheet having a sealing members according to a modified embodiment.

2) Modified Embodiment 2 (see FIGS. 11 and 12)

A modified embodiment having a modified sealing member is described hereafter. A light receiving module sheet 1B may be formed with the structure shown in FIG. 11. The light receiving module sheet 1B is provided with a sealing member 4B comprising a flexible cushion layer 46 that houses the solar battery elements 2 and mesh member 3 in an embedded manner and transparent surface layers 45 joined to the top and bottom surfaces of the cushion layer 46. The surface layers 45 are made of a transparent enforced glass plate having a thickness of approximately 2 mm.

In order to produce the light receiving module sheet 1B, a surface layer 45, an EVA (ethylene vinyl acetate) sheet, a mesh member 3 to which the solar battery elements 2 are joined, an EVA sheet, a surface layer 45 are superimposed in sequence and are heated in a laminate machine while vacuuming. Then, the EVA sheets melt, the EVA melt between the top and bottom surface layers 45 forms the cushion layer 46, and the cushion layer 46 fixes the solar battery elements 2 and mesh member 3.

The light receiving module sheet 1B may be reduced in cost and weight by using the surface layers 45 made of a transparent plate member such as polycarbonate and acrylic resins. The cushion layer 46 may be made of a transparent resin such as PBV (polyvinyl butyral), acryl, and silicone.

The structure in which the solar battery elements 2 and mesh member 3 are placed between two surface layers 45 improves strength relative to mechanical shock, and the see-through light receiving module sheet may be used as a window glass.

On the other hand, a light receiving module sheet 1C is provided with the sealing member 4C shown in FIG. 12. The sealing member 4C of the light receiving module sheet 1C comprises, from the bottom, a flexible PE (polyester) resin film 50, an aluminum deposited film 51, a PE resin reflecting multilayer film 52, a filler 53 made of an EVA resin and in which the solar battery elements 2 and mesh member 3 are embedded in a manner similar to the above cushion layer, a PE resin layer 54, a heat ray reflecting film 55, and an PE resin layer 56.

The reflecting film 52 is formed on the side surface opposite to the light entrance side, and reflects and scatters light entering from the entrance side and passing through between the solar battery elements 2 so that the light reaches the solar battery elements 2, leading to more efficient light usage and, accordingly, more efficient power generation. The heat ray reflecting film 55 has a multilayer structure consisting of polymer materials having different refractive indices. Because of interference caused by the multilayer structure, the heat ray reflecting film 55 selectively reflects heat rays not absorbed by the solar battery elements 2 (wavelength of 350 nm or larger), preventing the solar battery elements 2 from being heated and leading to more efficient photoelectric conversion. Hence, when light enters from the light receiving surface (the top surface) of the light receiving module sheet 1C, first, undesired heat ray is partially reflected by the heat ray reflecting film 55 and the remaining light is partially received by the solar battery elements 2 and partially passes between the solar battery elements 2. Light that has passed through is reflected by the reflecting film 52 and received by the solar battery elements 2.

Flexible synthetic resins such as polycarbonate, polyethylene naphtharate, and fluorocarbon resin may be used in place of PE resins, silicone and polyvinyl butyral resin may be used for the filler 53 in place of EVA resin, and the reflecting film 52 and heat ray reflecting film 53 may be eliminated as appropriate. Other layers may be modified as appropriate according to the desired function.

3) Modified Embodiment 3

The light receiving module sheet may be produced by a roll-to-roll technique. When a roll-to-roll technique is used, the mesh member is fixed at both ends in the width-wise direction using heat-resistant resin films such as polyimide films. Sprocket holes are formed in the heat-resistant resin films. The sprockets holes are engaged in sprockets to roll the mesh member in or out.

4) Modified Embodiment 4

In the afore-mentioned embodiment, the spherical elements of the light receiving module sheet are solar battery elements. However, the spherical elements are not restricted to solar battery elements and may be spherical photodiodes or light emitting diodes. These spherical photodiodes or light emitting diodes have nearly the same structure as the solar battery elements 2 described above and are described in detail in WO98/15983 by the inventor of this application and, therefore, their explanation is omitted. In a light emitting module sheet having light emitting diodes, a forward electric current is applied to the light emitting diodes, the electric energy is converted to optical energy by the pn junction, light having a wavelength depending on the crystal and diffused layer material is generated at the pn junction and externally emitted. Light is emitted in all directions from a light emitting module sheet having spherical light emitting diodes. Alternatively, light may be emitted only in a desired direction by providing a reflecting sheet in part. Further, three, R, G, and B, color light emitting diodes are arranged in a matrix and the light emitting diodes are controlled by a controller. Subsequently the light emitting module sheet may be used as a color display. One color light emitting diodes may be used to constitute a single color display. A light receiving module sheet having photodiodes can convert light in all directions to electric signals.

5) Modified Embodiment 5

In the afore-mentioned embodiment, the solar battery elements in all columns are connected in series. However, multiple switches may be provided to change the number of columns to be connected in series, and are turned on/off by a controller depending on light intensity and required electric energy.

6) Modified Embodiment 6

In the afore-mentioned embodiment, a sealing member is provided. However, the sealing member is not necessarily provided and may be omitted as appropriate.

7) Modified Embodiment 7

The number of the tension wires may be changed as appropriated. In the afore-mentioned embodiment, a set of three tension wires 22 is provided between the rows of solar battery elements. The number of tension wires is not restricted to three and a set of one or more wires may be provided.

The tension wire may be made of highly strong synthetic resins or plastics such as insulating aramide fibers. In this way, a light receiving or emitting module sheet can be provided with improved flexibility and tensile strength and material costs may be reduced.

Figure 13:
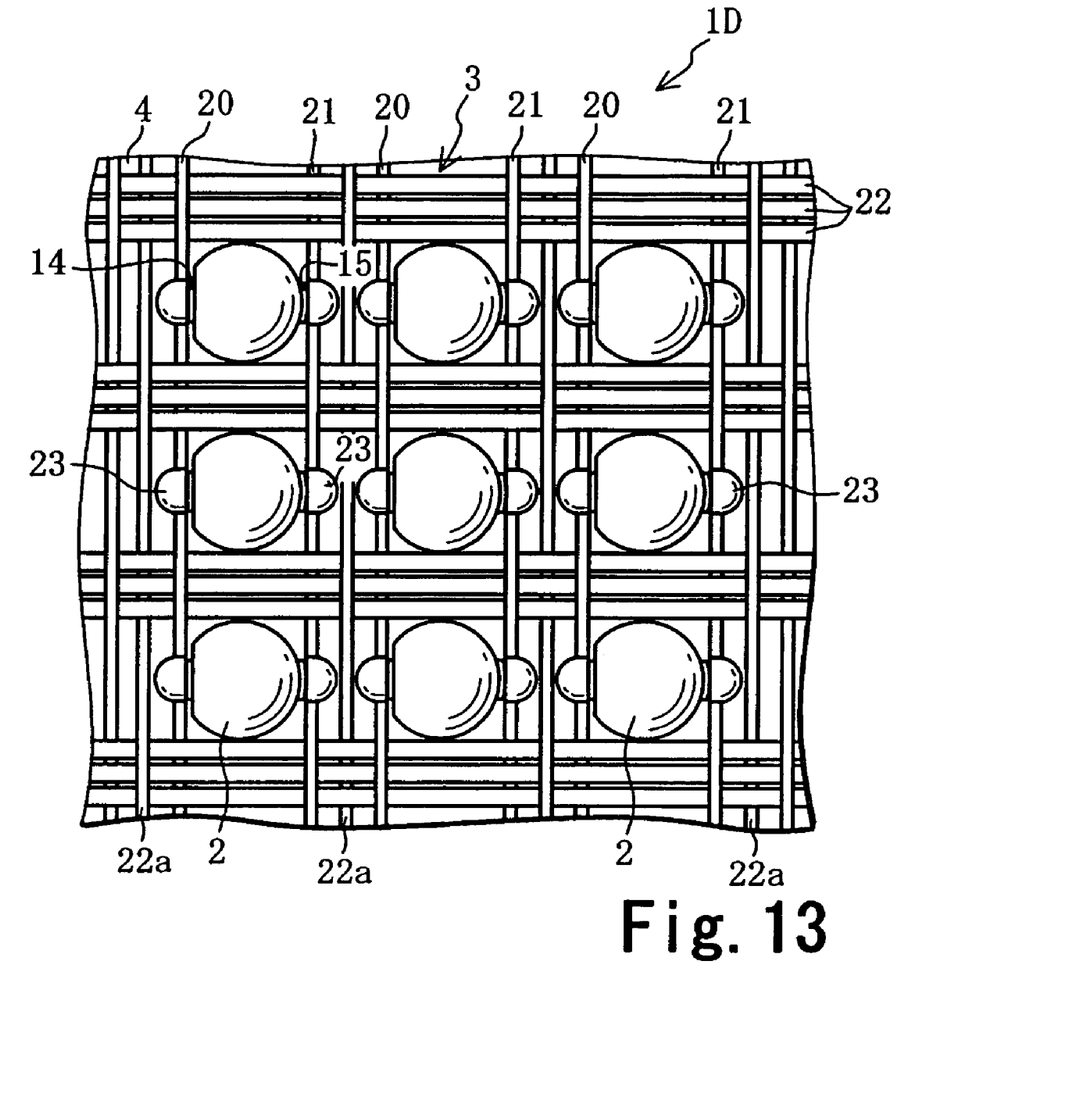
FIG. 13 is a partial enlarged plane view of a light receiving module sheet according to a modified embodiment.

The insulating tension wires 22 are not necessarily arranged orthogonally to the conductive wires. FIG. 13 shows a light receiving module sheet 1D in which tension wires 22a are provided between columns of solar battery elements in parallel to the conductive wires 20, 21 and woven with them. With this structure, the tensile strength in the direction that the conductive wires extend may be improved. In FIG. 13, the same reference numbers are given to the same components as in the afore-mentioned embodiment and their explanation is omitted.

8) Modified Embodiment 8

In the afore-mentioned embodiment, each column has positive and negative conductive wires. However, one wire may be shared by adjacent positive electrode conductive wire and negative electrode conductive wire. With this structure, the serial connection conductive wires may be omitted for a simple structure and the distance between columns may be reduced, by which a light receiving or emitting module sheet is down-sized.

9) Modified Embodiment 9

In the afore-mentioned embodiment, the spherical solar battery element 2 has the flat surface 11. However, a solar battery element without the flat surface 11 may be applied. With this structure, it is desirable that positive and negative electrodes be formed in different shapes, by which the positive and negative electrodes are easily identified.

The present invention is not restricted to the embodiments described above. Various modifications may be made to the afore-mentioned embodiments by one of ordinary skill in the field without departing the scope of the present invention and those modifications incorporated in the present invention.

What is claimed is:

1. A method of producing a light receiving and light emitting module sheet comprising:
providing plural function elements having a light receiving or light emitting function,
providing said function element with positive and negative connective wire connecting parts,
arranging the plural function elements in plural columns,
providing pairs of conductive wires that connect in parallel,
providing plural insulating wires woven into a mesh structure with said plural conductive wires,
disposing said plural function elements in said mesh structure between each pair of conductive wires wit the conductive direction thereof aligned,
contacting the positive and negative conductive wire connecting parts of said function elements with corresponding conductive wires,
supplying current to said conductive wires, and
utilizing said supplied electric current to effect joining of said positive and negative conductive wire connecting parts of said function elements with corresponding conductive wires with alloyed connections.

2. A method according to claim 1, wherein said alloyed connections between the function element and the conductive wires serve as electrodes.

3. A method according to claim 1, wherein said function elements comprise silicon and said conductive wires are eutectic reactive to silicon.

4. A method according to claim 1, wherein said step of providing function elements comprises producing the function elements without electrodes, said step of disposing the plural function elements in said mesh structure comprising disposing the function elements without electrodes in said mesh structure.

5. A method according to claim 1, wherein said step of applying current to said conductive wires comprises applying a pulsed direct current to the conductive wires.

6. A method according to claim 1, comprising forming said alloyed connections between 570° C. to 650° C.

7. A method of producing a light receiving and light emitting module comprising:
providing plural spherical elements with positive and negative connective wire connecting parts,
arranging the plural spherical elements in plural columns,
providing pairs of conductive wires that connect in parallel,
providing plural insulating wires woven into a mesh structure with said plural conductive wires,
disposing said plural spherical elements in said mesh structure,
contacting the positive and negative conductive wire connecting parts of each spherical element with corresponding conductive wires,
supplying electric current to said conductive wires, and
utilizing said supplied electric current to effect joining of said positive and negative conductive wire connecting parts of said spherical elements with corresponding conductive wires.

8. A method according to claim 7, wherein said conductive wires are metal alloy conductive wires have lower electrical and thermal conductivity than aluminum, and further comprising coating joining parts between the metal alloy conductive wires and the spherical elements with aluminum containing silicon or an aluminum alloy containing silicon.

9. A method according to claim 7, wherein said conductive wires are copper conductive wires, and further comprises coating joining points to the copper wires with a gold alloy.

* * * * *